(12) United States Patent
Shionoiri et al.

(10) Patent No.: US 7,332,815 B2
(45) Date of Patent: Feb. 19, 2008

(54) SEMICONDUCTOR DEVICE

(75) Inventors: Yutaka Shionoiri, Kanagawa (JP); Tomoaki Atsumi, Kanagawa (JP); Kiyoshi Kato, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 367 days.

(21) Appl. No.: 11/005,963

(22) Filed: Dec. 7, 2004

(65) Prior Publication Data

US 2005/0140015 A1   Jun. 30, 2005

(30) Foreign Application Priority Data

Dec. 12, 2003   (JP) ............................. 2003-415169

(51) Int. Cl.
*G03C 1/85* (2006.01)
(52) U.S. Cl. .............................. 257/773; 257/E21.657; 257/E27.111
(58) Field of Classification Search ................ 257/773, 257/E21.657, E27.111
See application file for complete search history.

(56) References Cited

U.S. PATENT DOCUMENTS 5,798,547 A * 8/1998 Urai ........................... 257/316
6,687,148 B2 * 2/2004 Shau ............................ 365/63
6,768,348 B2    7/2004 Shionoiri et al.
7,130,234 B2   10/2006 Shionoiri et al.
7,158,439 B2    1/2007 Shionoiri et al.
7,200,050 B2    4/2007 Kato
2005/0135181 A1  6/2005 Shionoiri et al.
2006/0267907 A1 * 11/2006 Koyama et al. .............. 345/98
2007/0064511 A1  3/2007 Shionoiri et al.

* cited by examiner

*Primary Examiner*—Leonardo Andujar
*Assistant Examiner*—Krista Soderholm
(74) *Attorney, Agent, or Firm*—Cook, Alex, McFarron, Manzo, Cummings & Mehler, Ltd.

(57) ABSTRACT

The present invention has an object to provide a semiconductor device, an ID tag, in which delay of signal transmission with conductive layers is controlled. In addition, the other object is that a design method of such a semiconductor device is provided.

A semiconductor device of the invention comprises a plurality of conductive layers, a plurality of first element groups each of which selects one among the conductive layers and a plurality of second element groups each of which amplifies a signal each transmitted from the conductive layers. Each of the second element groups is disposed between the first element groups. Stated another way, the first element group and the second element group are disposed alternately. The delay of the signal transmission with the plurality of conductive layers is controlled because a load by a parasitic capacitance is reduced due to the above feature.

34 Claims, 11 Drawing Sheets

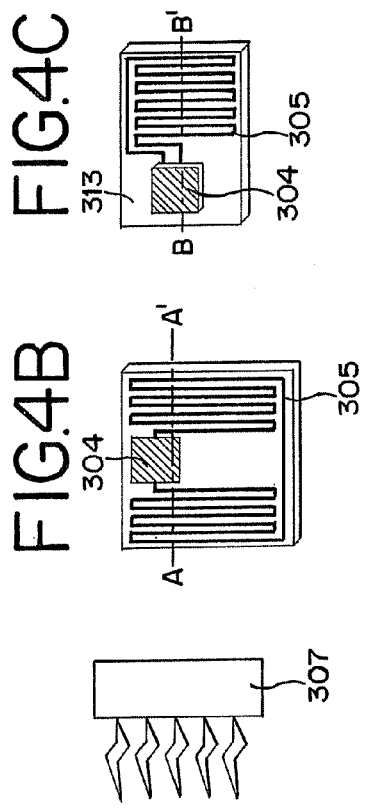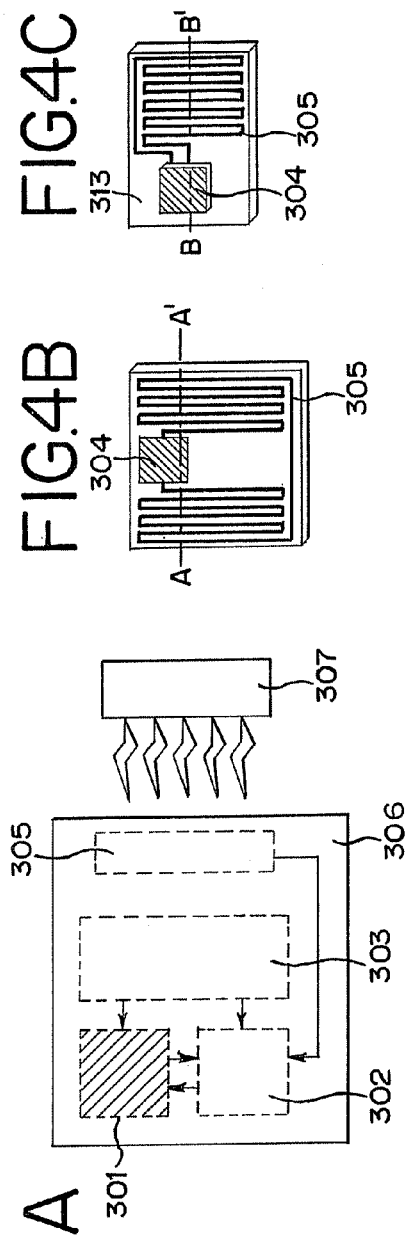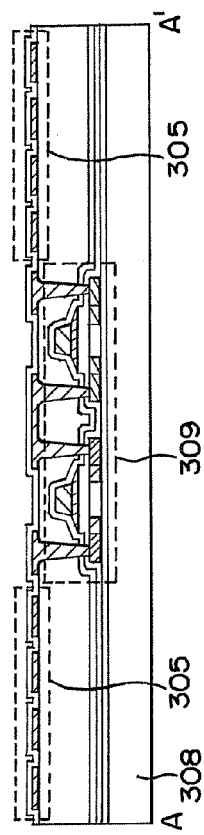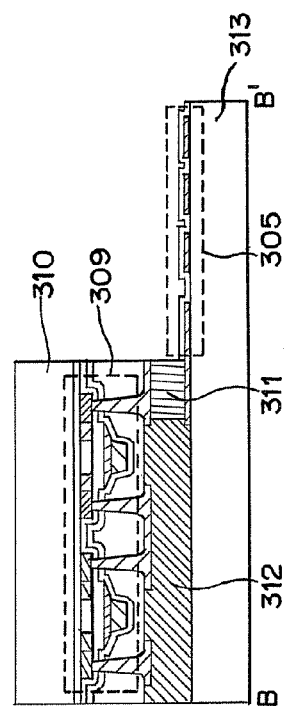

SEMICONDUCTOR DEVICE

BACKGROUND OF THE INVENTION

1. Field of the Invention

The present invention relates to a semiconductor device having a semiconductor element and a design method thereof. In addition, the invention relates to a semiconductor device (hereinafter, referred to as "ID tag") in which data communication is possible by wireless communication.

2. Description of the Related Art

In recent years, a semiconductor device having a semiconductor element is applied to various fields, and research and development thereof are promoted. A semiconductor device comprises a plurality of conductive layers 11, a first element group 12 having a selecting function, and a plurality of second element groups 13 each having an amplifying function on a substrate 10 having an insulating surface (FIG. 11). Ordinarily, a region where the conductive layers 11 are formed is disposed in the middle of the substrate 10, and a region 14 where the first element group 12 is formed is disposed on one side among the left, right, top and bottom of the region where the conductive layers 11 are formed. Second regions 15, 16, 17 and 18 where the second element groups 13 are formed, respectively, are disposed opposing to the region where the conductive layers 11 are formed with the region 14 interposed therebetween.

Note that the region 14 where the first element group 12 is formed is split into a plurality of element formation regions 95 correspondingly to the number of the conductive layers 11. Usually, a pitch 19 in rows of the element formation region 95 is same as a pitch 20a between the conductive layers 11. In addition, the conductive layers 11 take a role in transmitting a signal, and specifically, they take a role such as transmitting a signal supplied from a driver and a controller to an element, or transmitting a signal read from an element to other units such as an amplification unit.

The above structure shows that the conductive layers 11 are connected to the second element arrays 13 through the first element arrays 12. In other words, the conductive layers 11 intersect the first element arrays 12 and it is connected to the second element arrays 13. Then a parasitic capacitance is generated between the first element arrays 12 and the conductive layers 11. This parasitic capacitance becomes a load and therefore signal transmission with the conductive layers 11 delays.

SUMMARY OF THE INVENTION

In view of the above problems, it is an object of the invention to provide a semiconductor device, and an ID tag, in which the delay of signal transmission with the conductive layers 11 is controlled. In addition, it is another object of the invention to provide a design method of such a semiconductor device.

In order to solve the foregoing problem of the conventional technology, the invention provides a semiconductor device, a design method thereof and an ID tag having a following structure.

A semiconductor device of the invention comprises a plurality of conductive layers, first element groups each of which selects one among the conductive layers and second element groups each of which amplifies a signal each transmitted from the conductive layers. Each of the second element groups is disposed between two of the first element groups. Stated another way, the first element group and the second element group are disposed alternately. Delay of signal transmission with the plurality of conductive layers is controlled because a load by a parasitic capacitance is reduced due to the above feature.

In addition, the first element group comprises a plurality of elements constituting a part of a decoder. Further, the second element group comprises a plurality of elements constituting a sense amplifier.

In addition, the region where the first element group is formed comprises a plurality of element formation regions correspondingly to the number of conductive layers. A pitch in rows of an element formation region selected among the plurality of element formation regions is different from a pitch between the plurality of conductive layers.

In addition, the plurality of conductive layers, the first element groups and the second element groups are disposed on a substrate and the substrate is a glass substrate. An inexpensive semiconductor device can be provided according to the feature.

In addition, a semiconductor device of the invention comprises a memory element, as well as the above constituents. Further, the semiconductor device of the invention comprises a light-emitting element or a liquid crystal element. A high function and a high value-added are realized according to the above feature.

An ID tag of the invention comprises a control unit, a power generation unit and a transmitting and receiving unit as well as the above constituent of the semiconductor device. Delay of signal transmission is controlled because a load by a parasitic capacitance is reduced due to the above feature.

A design method of a semiconductor device of the invention, having a plurality of conductive layers, the first element groups each of which selects one among the conductive layers and the second element groups each of which amplifies a signal each transmitted from the conductive layers, comprises the step of arranging each second element group between the first element groups. Stated another way, it comprises the step of arranging the first element group and the second element group alternately.

In addition, the design method of a semiconductor device according to the invention comprises the step of arranging the first and second element groups on one side among the left, right, top and bottom of a region where the plurality of conductive layers are formed. Further, it comprises the step of disposing the plurality of conductive layers regularly.

A semiconductor device, a design method thereof and an D tag in which delay of signal transmission is controlled can be provided according to the invention having the above structure.

BRIEF DESCRIPTION OF THE DRAWING

FIGS. 4A to 4E show diagrams illustrating Embodiment Mode 3 according to the invention.

DETAILED DESCRIPTION OF THE INVENTION

Figure 1:
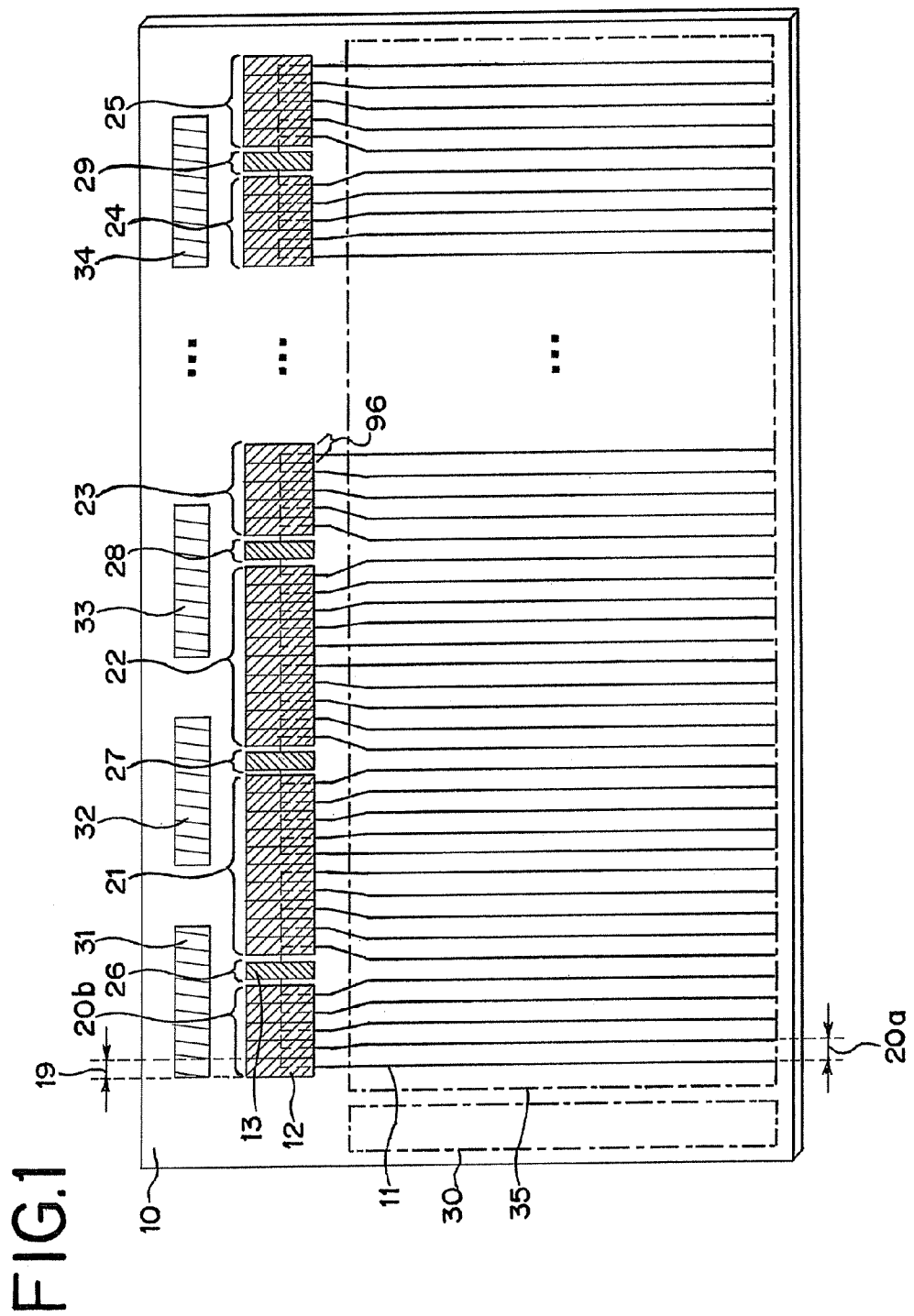
FIG. 1 shows a diagram illustrating Embodiment Mode 1 according to the invention.

Hereinafter, embodiment modes of the invention are described in detail with reference to the drawings. However, the invention should not be limited to the following description, and it is easily understood by those skilled in the art that the mode and the detail of the invention can be variously changed without departing from the purpose and the scope of the invention. Therefore, the invention can be construed without the limitation of the description of the embodiment modes. Note that reference numerals denoting the same things are used in common among different drawings in a structure of the invention explained below.

Embodiment Mode 1

A semiconductor device according to the invention comprises a plurality of conductive layers 11, a plurality of first element groups 12 and a plurality of second element groups 13 formed on a substrate having an insulating surface (FIG. 1). In the invention, the second element group 13 is disposed between the first element groups 12. Stated another way, the first element arrays 12 and the second element arrays 13 are disposed alternately. In other words, in the invention, each of second regions 26, 27, 28 and 29 on which the second element groups 13 are formed, respectively, is disposed between first regions 20b, 21, 22, 23, 24 and 25 each of which forms the first element group 12. Stated another way, the first regions 20b, 21, 22, 23, 24 and 25 each of which forms the first element group 12 and the second regions 26, 27, 28 and 29 each of which forms the second element group 13 are disposed alternately.

According to the above feature, the conductive layers 11 are connected to the second element groups 13 but not through the first element groups 12. In other words, a parasitic capacitance generated between the conductive layers 11 and the first element arrays 12 is reduced. Therefore, an effect that delay of signal transmission in using the conductive layers is controlled due to the reduced load of the parasitic capacitance is shown.

One reason of the above effect is that a pitch 19 in rows of one element formation region 96 that is a segment of the first element arrays 12 is different from a pitch 20a between the conductive layers 11. Note that the pitch between the conductive layers 11 corresponds to a distance between one of the conductive layers 11 in an n-th row (n is a natural number) and one of the conductive layers 11 in an (n+1)-th row, namely a dot-pitch.

In addition, a semiconductor device of the invention has a memory element on the substrate 10 as well as the above constituent. The memory element is one or more selected among a transistor, a capacitor element, and a resistor element. When a semiconductor device of the invention is a DRAM (Dynamic Random Access Memory), the memory element comprises one transistor and one capacitor element. In the case of an SRAM (Static Random Access Memory), the memory element comprises six transistors; five transistors; four transistors and two resistor elements; or four transistors and one resistor element. Note that when six transistors, or four transistors and two resistor elements are used as the memory element, two bit lines (one of them is a bit line and another is a bit bar line) are arranged in each column. In the case of a mask ROM (Read Only Memory), the memory element corresponds to a transistor. With regard to the mask ROM, data is written during the production process. In addition, a transistor is fabricated when either data of H level or L level is written and one more transistor is not fabricated when the other data is written. Also, different transistors may be fabricated when both data of H level and L level are written. Note that the semiconductor device of the invention is not limited to a DRAM, an SRAM, or a mask Rom and the followings are possible according to the structure of a memory element. An FRAM (Ferroelectric Random Access Memory), a PROM (Programmable Read Only Memory), an EPROM (Electrically Programmable Read Only Memory), an EEPROM (Electrically Erasable Read Only Memory), a Flash Memory, or the like may be used.

A region 35 comprising the plurality of conductive layers 11 corresponds to a memory cell array, and the conductive layers 11 each corresponds to a bit line. In addition, a plurality of conductive layers are disposed in rows as well as in columns in the region 35 disposing the memory cell array (not shown in FIG. 1). The conductive layers in rows correspond to word lines. In addition, the region 35 disposing the memory cell array comprises a plurality of memory cells arranged in a matrix (not shown in FIG. 1). The memory cell comprises a memory element in a region where the bit line and the word line intersect with an insulator interposed therebetween. When the memory element comprises one transistor and one capacitor element, a gate electrode of the transistor is connected to the word line, either of a source electrode or a drain electrode is connected to the bit line, and the other is connected to either of electrodes of a capacitor element.

The first element group 12 comprises a plurality of elements constituting a part of a decoder. The decoder is constituted of a plurality of logic circuits. In other words, the first element group 12 comprises an element constituting the plurality of logic circuits. The decoder comprises a function to select one conductive layer 11 among the plurality of conductive layers 11.

The second element arrays 13 correspond to a plurality of elements constituting a sense amplifier. The sense amplifier is constituted of a plurality of TFTs. In other words, the second element arrays 13 comprises the plurality of TFTs. The sense amplifier is ordinarily constituted of a total of five TFTs: two TFTs whose gate electrodes are connected to each other, two TFTs whose gate electrodes are input nodes, and one TFT whose gate electrode receives a bias voltage.

In addition, a semiconductor device of the invention may comprise a display element as represented by a liquid crystal element and a light-emitting element on the substrate 10. In other words, in the invention, a plurality of pixels each including a display element and a TFT for controlling the display element may be disposed on the substrate 10. A semiconductor device with a high function and a high value-added, which can display characters and, can be provided, by controlling lighting or non-lighting of a plurality of pixels.

In addition, the substrate 10 is a glass substrate. The above features enable a mass production of inexpensive semiconductor devices as compared with the case of using single crystalline substrates.

A semiconductor device of the invention comprises a region 30 in which a plurality of element groups constitute a decoder which selects one among a plurality of conductive layers (word lines) disposed in rows. In addition, it comprises regions 31, 32, 33 and 34 including a plurality of element groups and having an output amplifying function or a readout/writing selecting function.

A design method of a semiconductor device according to the invention comprises the step of arranging the second element group 13 between the first element groups 12. Stated another way, it comprises the step of arranging the first element group 12 and the second element group 13 alternately. In addition, the design method of the semiconductor device according to the invention has the step of arranging the first regions 20b, 21, 22, 23, 24 and 25 each having the first element group 12 and the second regions 26, 27, 28 and 29 each having the second element group 13, on one side among the left, right, top and bottom of the region 35 where the memory cell array forming the plurality of conductive layers 11 is formed. And the conductive layers 11 are disposed regularly. A semiconductor device completed by the above design method can control the delay of signal transmission occurred in the conductive layers 11.

Embodiment Mode 2

Figure 2A:
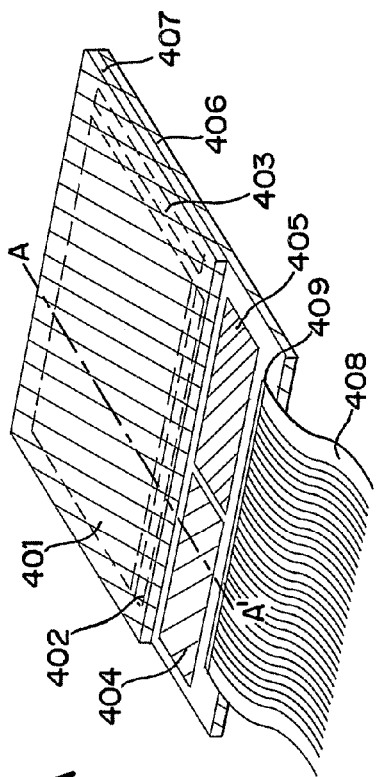
FIGS. 2A and 2B show diagrams illustrating Embodiment Mode 2 according to the invention.

A panel that is one mode of a semiconductor device according to the invention is described by using the drawings. The panel comprises a pixel portion 401 having a plurality of pixels and driver circuits 402 and 403 each including a plurality of transistors over a substrate 406 (FIG. 2A). The driver circuits 402 and 403 may be attached externally or may be mounted on the substrate 406 by a COG (Chip On Glass) or the like, without being formed integrally on the substrate 406. Thus, a display unit comprises only the pixel portion 401, or the pixel portion 401 and the driver circuits 402 and 403. In addition, the panel comprises a memory unit 404 corresponding to a VRAM (memory for screen display), a RAM or a ROM and a CPU (Central Processing Unit) 405 over the substrate 406. Further, the panel comprises an input terminal 409 for supplying a signal controlling the driver circuits 402 and 403, the memory unit 404 and the CPU 405 over the substrate 406. The input terminal 409 is supplied with a signal such as a video signal or a potential through a connection film 408. In addition, the panel comprises sealing member (not shown in FIG. 2A) surrounding the pixel portion 401 and the driver circuits 402 and 403, and an opposing substrate 407 is stuck with the substrate 406 by the sealing member. Note that the opposing substrate 407 is disposed only over the pixel portion 401 and the driver circuits 402 and 403 in the panel illustrated, but it may be disposed over the entire surface. In addition, a cooling wheel is preferably formed so as to contact with the CPU 405 because the CPU 405 has a risk of generating heat.

Figure 2B:
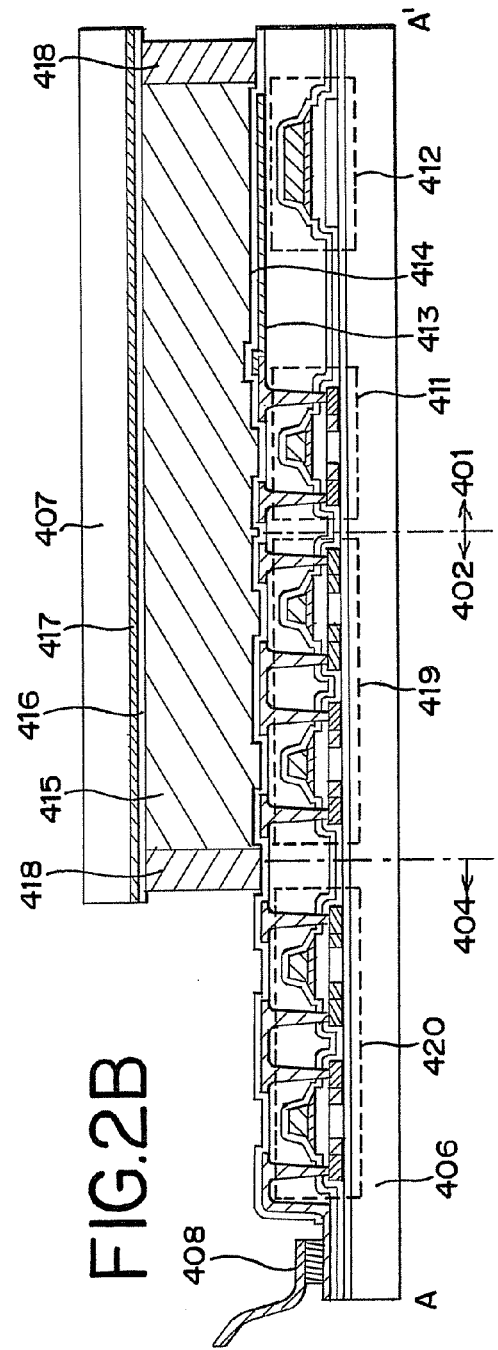

FIG. 2B shows a cross-sectional view along a line A-A' of the panel. The pixel portion 401 comprises a TFT 411 and a capacitor element 412; the driver circuit 402 has an element group 419 comprising TFTS; and the memory unit 404 has an element group 420 comprising TFTs. Between the substrate 406 and the opposing substrate 407, a pixel electrode 413, an orientation film 414, a liquid crystal layer 415, an orientation film 416, a counter electrode 417, and a sealing material 418 are comprised. A polarizing plate is stuck on each of the substrate 406 and the opposing substrate 407.

An element that constitutes a circuit over the substrate 406 is preferably formed of a polycrystalline semiconductor (poly-silicon) which is superior in a property such as mobility in comparison with an amorphous semiconductor, and then a monolithic panel is realized. In this way, a panel in which a functional circuit such as a memory unit and a CPU are formed integrally in addition to a pixel portion and a driver circuit, is referred to as a system on a panel, and it can implement a multifunctional system. A panel having the above structure can realize downsizing, lightweight and thinness because the number of connected external ICs decreases, and it is quite effective to apply the panel to a potable terminal which has came into wide use recently. Note that in this mode, a panel using a liquid crystal element as a display element is shown, but the invention is not limited to this. It may be applied to a panel using other display elements such as a light-emitting element as a display element.

Figure 3:
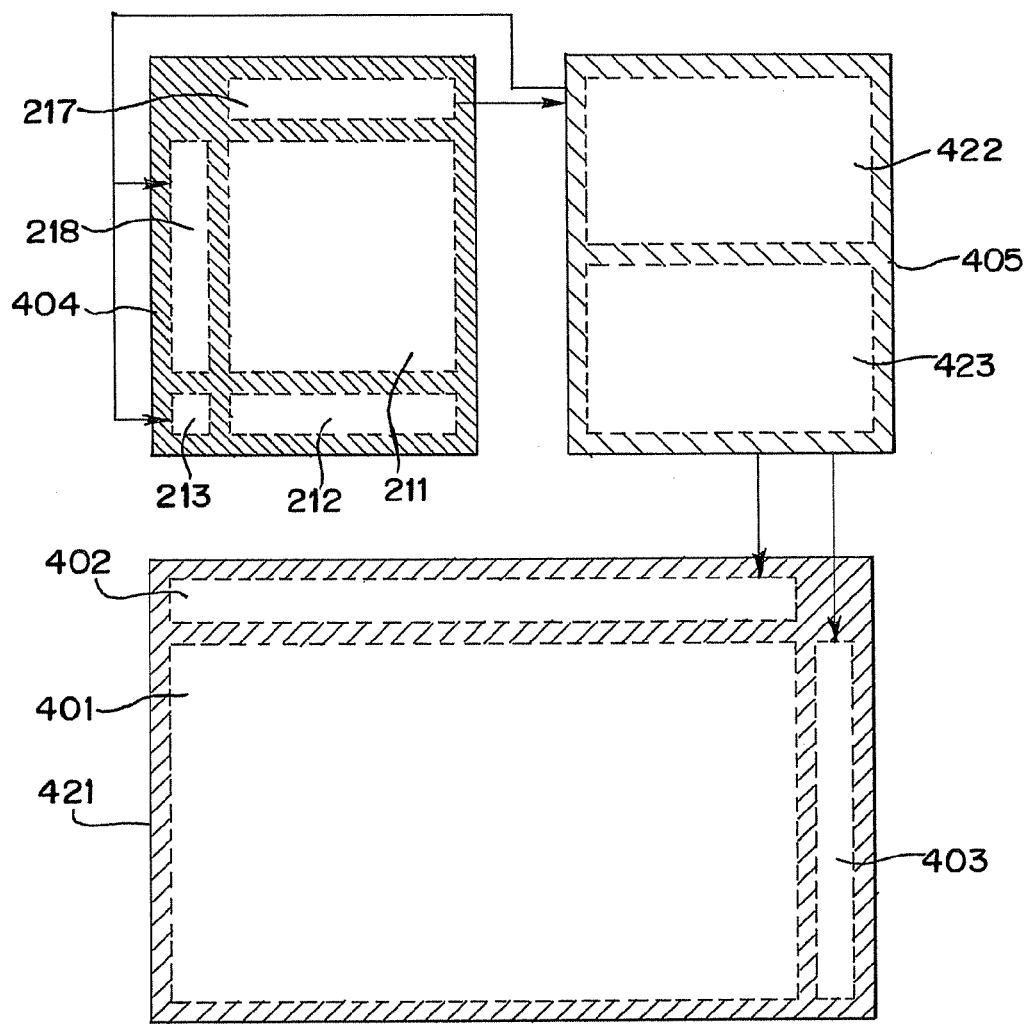
FIG. 3 shows a diagram illustrating Embodiment Mode 2 according to the invention.

In the above panel, the structure of the semiconductor device explained in Embodiment Mode 1 and FIG. 3 is applied to the structure of the memory unit 404.

Next, interrelation among a display unit 421 including the pixel portion 401 and the driver circuits 402 and 403, the memory unit 404 and the CPU 405 and the serial operation thereof are briefly described as follows (FIG. 3).

The memory unit 404 includes a data holding unit 211, a precharge unit 212, a delay unit 213, a column decoder 217 and a row decoder 218. The CPU 405 includes a control section 422 and an operational portion 423.

First, when reading or writing of data is conducted from the memory unit 404, information of an address of a memory cell in which data is stored or a memory cell to store data is supplied for the row-decoder 218 which is an address selecting unit and the delay unit 213 included in the memory unit 404 from the program counter in the control section 422 of the CPU 405.

Information read from a specified address is supplied for a control register in the control section 422, from the column-decoder 217. In addition, information to be written in a specified address is supplied from a register in the arithmetic section 423.

An image in the pixel portion 401 included in the display unit 421 is displayed according to a signal supplied with the driver circuits 402 and 403 from the CPU 405. Note that when a video signal is stored in the memory unit 404, it is supplied to the driver circuit 402 of the signal line side from the memory unit 404 through the CPU 405.

This embodiment mode can be freely combined with the embodiment mode described above.

Embodiment Mode 3

A structure of an ID tag (also referred to as an RFID tag, an IC tag, an electronic tag, an IC chip, a radio chip, a radio processor, and a radio memory) according to the invention is explained. An ID tag 306 of the invention comprises an IC chip 304 including a memory unit 301, a control unit 302 and a power generation unit 303, and an antenna 305 (also referred to as a transmit and receive unit) (FIGS. 4A and 4C).

In the panel, the structure of the semiconductor device described in Embodiment Mode 1 is applied to the structure of the memory unit 301. Note that the memory unit 301 can be a RAM, a ROM or the like according to a structure of a memory element, but a ROM is preferably used as the memory unit 301.

The control unit 302 is configured with a logic circuit. The control unit 302 (also referred to as a control circuit) corresponds to a CPU (Central Processing Unit). In the case of a non-contact type, electromagnetic induction or mutual induction of an antenna 305 wound up in the shape of coil, or induction by static electricity is used for the power generation unit 303 (also referred to as a power generation circuit). Thus, in this case, the power generation unit 303 operates in conjunction with the antenna 305. The antenna 305 can select height of frequency to receive by controlling the number of windings.

As for the antenna 305, a method for forming the antenna 305 on the same substrate as the IC chip 304 (FIGS. 4B and 4D), or a method for mounting the IC chip 304 on a substrate 313 including the antenna 305 (FIGS. 4C and 4E) is adopted. When the former method is adopted, a group of TFTs 309 and the antenna 305 are disposed over a substrate 308 (FIG. 4D). On the other hand, when the latter method is adopted, a substrate 310 including the group of TFTs 309 is mounted over the substrate 313 including the antenna 305 with a conductive layer 311 and an insulating layer 312 interposed therebetween (FIG. 4E). Note that the group of TFTs 309 shown in FIGS. 4D and 4E is a constituent of one of the memory unit 301, the control unit 302 and the power generation unit 303.

Next, a communication procedure with the ID tag 306 is briefly explained hereinafter (FIG. 4A). First, the antenna 305 included in the ID tag 306 receives a radio wave from a reader-writer 307. Then, electromotive force occurs by resonance action in the power generation unit 303. The memory unit 301 and the control unit 302 included in the ID tag 306 are activated, and data in the memory unit 301 is transformed into a signal by the control unit 302. Next, a signal is sent from the antenna 305 in the ID tag 306. Then the ID tag 306 receives a signal transmitted by the antenna in the reader-writer 307. The received signal is transmitted to a data processing system (not shown in FIG. 4A) through a controller (not shown in FIG. 4A) in the reader-writer 307, and data processing is performed by using software. In the above communication procedure, a coiled antenna is used and an electromagnetic induction method using magnetic flux generated by induction between a coil of an ID tag and a coil of a reader-writer is adopted. However, the invention is not limited to the above methods, a radio wave method using a radio wave of a microwave band may be adopted.

The ID tag 306 has advantages that non-contact communication is possible; complement reading is possible; data writing is possible; processing into various shapes is possible; directivity is wide and a wide recognition range is provided depending on the selected frequency; and the like. The ID tag 306, in non-contact radio communication, can be applied to an IC tag which can identify individual information of a person or a thing, an adhesive label which is enabled to be attached to an object by label processing, a wristband for an event or an amusement, or the like. In addition, the ID tag 306 may be processed with a resin material and it may be directly fixed to a metal obstructing radio communication. Further, the ID tag 306 can be utilized for an operation of a system such as an entering-leaving management system or a checkout system.

Figure 5A:
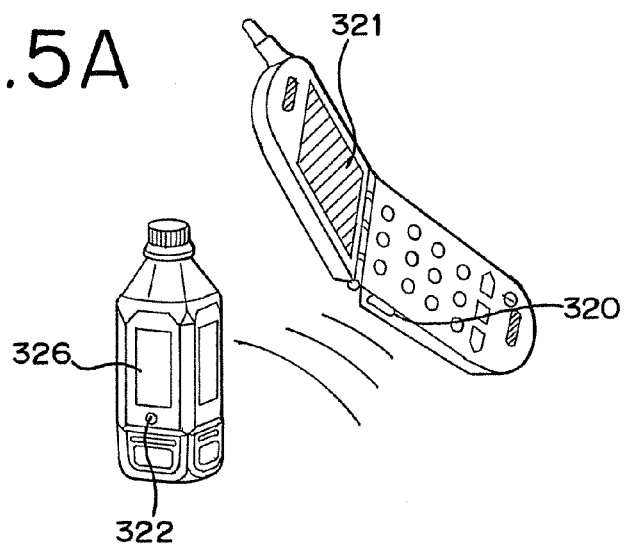
FIGS. 5A and 5B show diagrams illustrating Embodiment Mode 3 according to the invention.
Figure 5B:
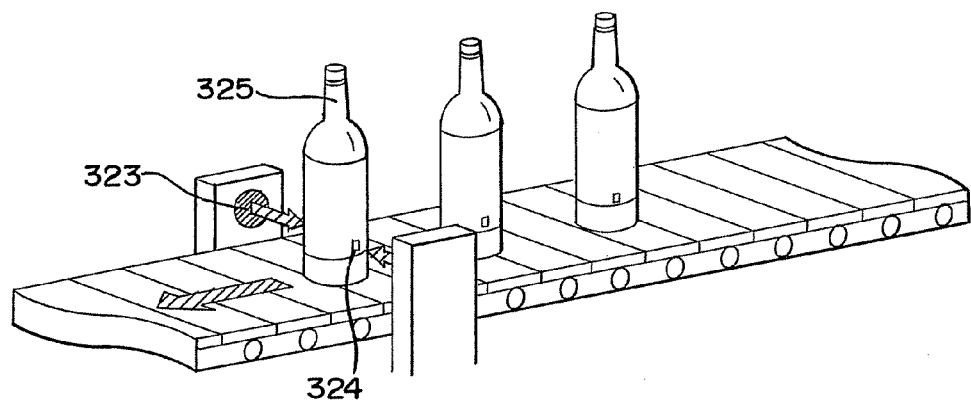

Next, one mode of the actual use of the ID tag 306 practically is explained. A reader-writer 320 is disposed in a side of a portable terminal including a display portion 321, and an ID tag 322 is disposed in a side of merchandise 326 (FIG. 5A). When the reader-writer 320 is held against the ID tag 322, information relating to merchandise, such as a raw material and a place of origin of the merchandise, a test result per production process, a record of distribution process, or further, description of the merchandise is displayed in the display portion 321. In addition, merchandise 325 can be inspected by using a reader-writer 323 and an ID tag 324 disposed in the merchandise 325, when the merchandise 325 is transported with a belt conveyor (FIG. 5B). In this manner, information can be easily obtained, and a high function and a high added value are realized by utilizing an ID tag for a system.

Embodiment 1

A mask layout of a semiconductor device is explained in this embodiment. The invention comprises a plurality of transmission units including conductive layers, selecting units including first element groups and amplification units including second element groups on a substrate having an insulating surface.

Figure 6:
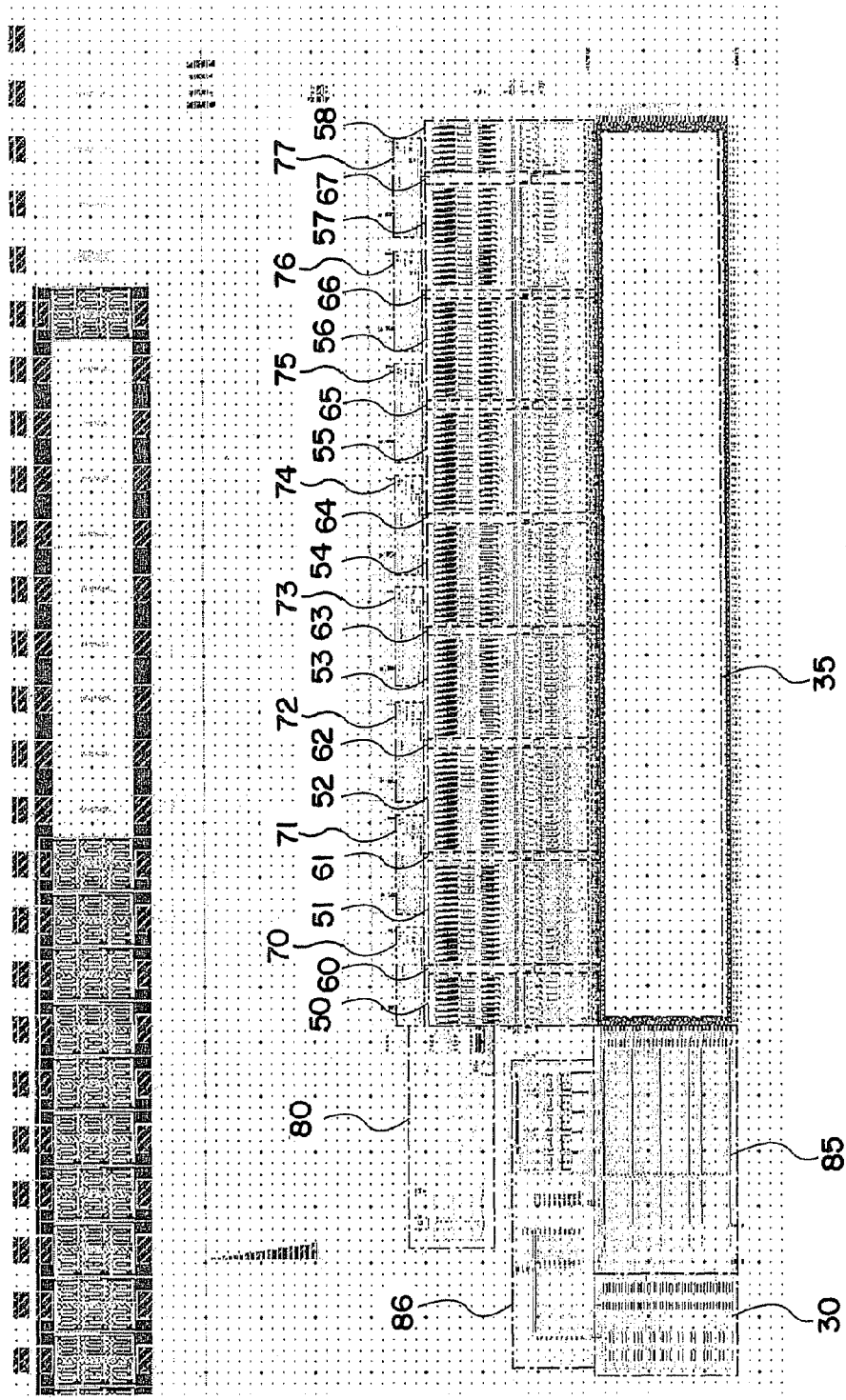
FIG. 6 shows a diagram illustrating Embodiment 1 according to the invention.
Figure 7:
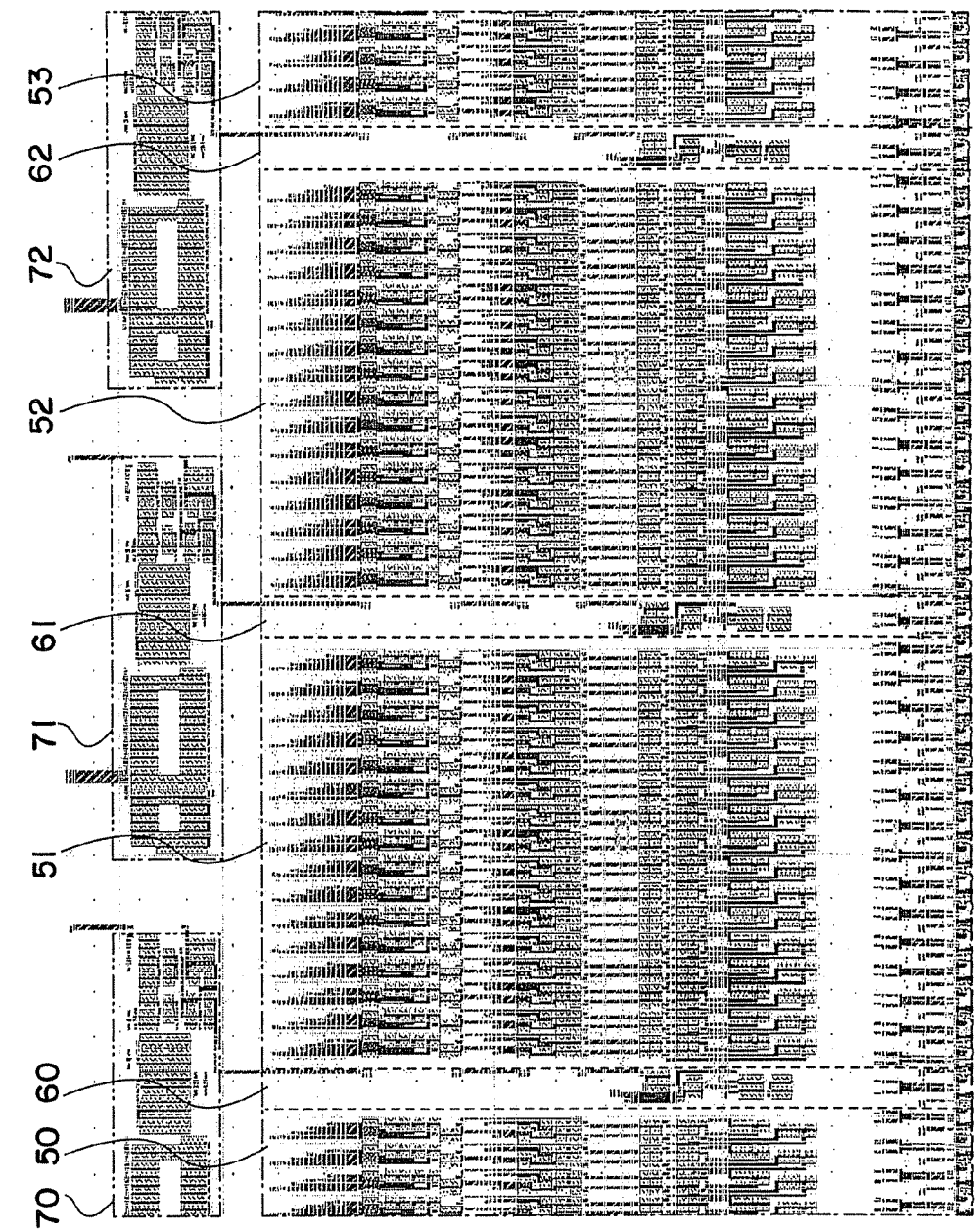
FIG. 7 shows a diagram illustrating Embodiment 1 according to the invention.

In the invention, second regions 60, 61, 62, 63, 64, 65, 66 and 67 forming the plurality of second element groups corresponding to the amplification units are disposed between first regions 50, 51, 52, 53, 54, 55, 56, 57 and 58 forming the plurality of first element groups corresponding to the selecting units (FIGS. 6 and 7). Stated another way, the first regions 50, 51, 52, 53, 54, 55, 56, 57 and 58 and the second regions 60, 61, 62, 63, 64, 65, 66 and 67 are disposed alternately.

A parasitic capacitance generated between the conductive layers and the plurality of first element groups is reduced due to the above feature. Therefore, delay of signal transmission with the conductive layers is controlled because a load by a parasitic capacitance is reduced.

In addition, a region 35 where a memory cell array, which regularly forms conductive layers (not shown in FIGS. 6 and 7), is disposed; regions 30 and 80 where element groups each corresponding to a part of a decoder are formed; regions 85 and 86 where element groups corresponding to a level shifter and a buffer are formed respectively; regions 70, 71, 72, 73, 74, 75, 76 and 77 where element groups corresponding to output amplification units are formed; and the like are disposed on the substrate comprising the first and second element groups.

Figure 8:
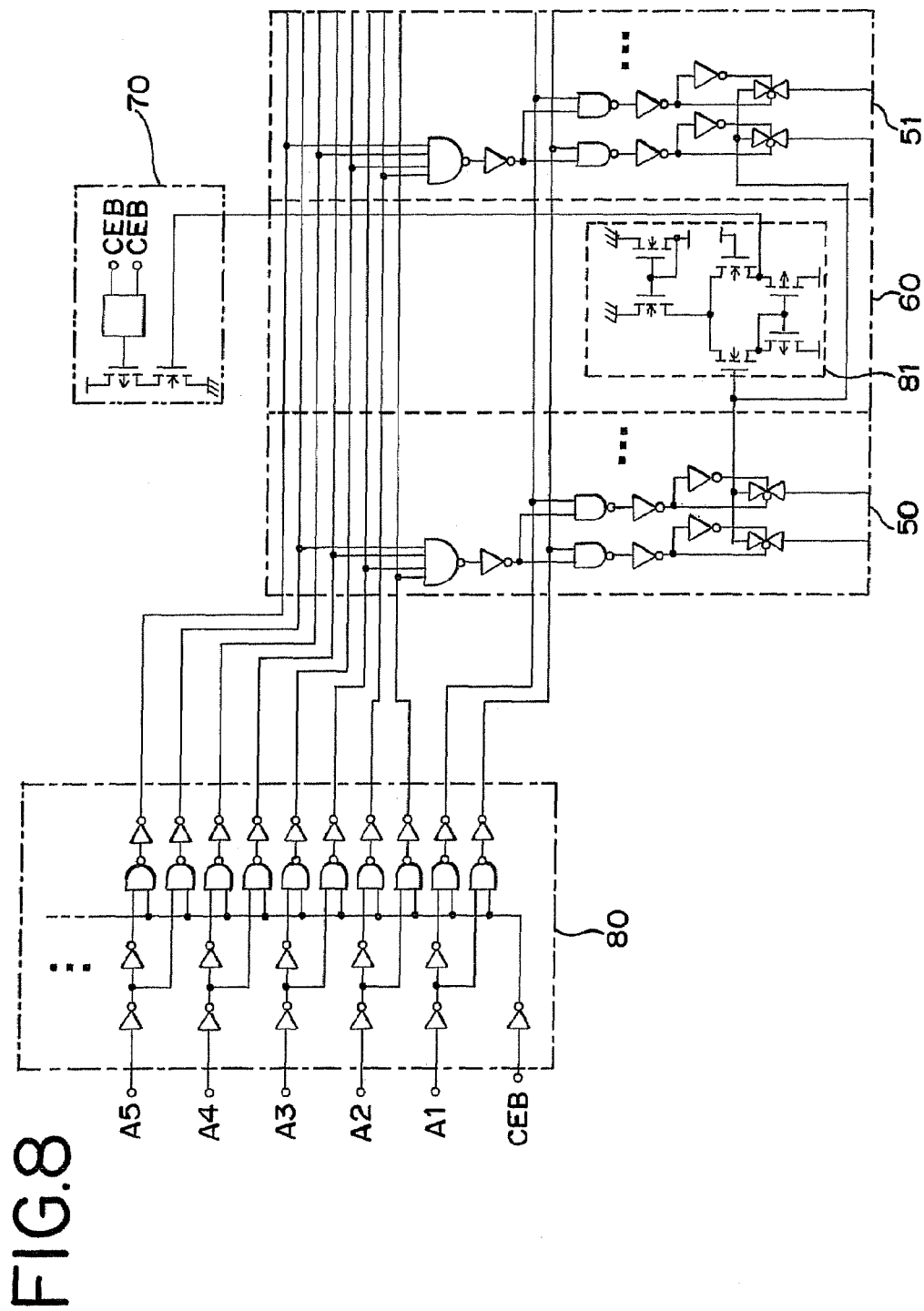
FIG. 8 shows a diagram illustrating Embodiment 1 according to the invention.

Subsequently, an equivalent circuit including a part of the decoder disposed in the region 80; the first element groups corresponding to the selecting units disposed in the first regions 50 and 51; the second element group corresponding to the amplification unit disposed in the second region 60; and the element group corresponding to the output amplification units disposed in the region 70, are explained (FIG. 8)

The part of the decoder disposed in the region 80 is comprised of a plurality of logic circuits and inverters as shown in the figure.

The first element groups having the selecting units disposed in the first regions 50 and 51 comprise a plurality of elements constituting the plurality of switches, logic circuits, and inverters. The plurality of second element groups which are the amplification units disposed in the second region 60 correspond to a plurality of elements constituting a sense amplifier 81. The element group having the output amplification units disposed in the region 70 comprises a plurality of TFTs and logic circuits.

Embodiment 2

Figure 9:
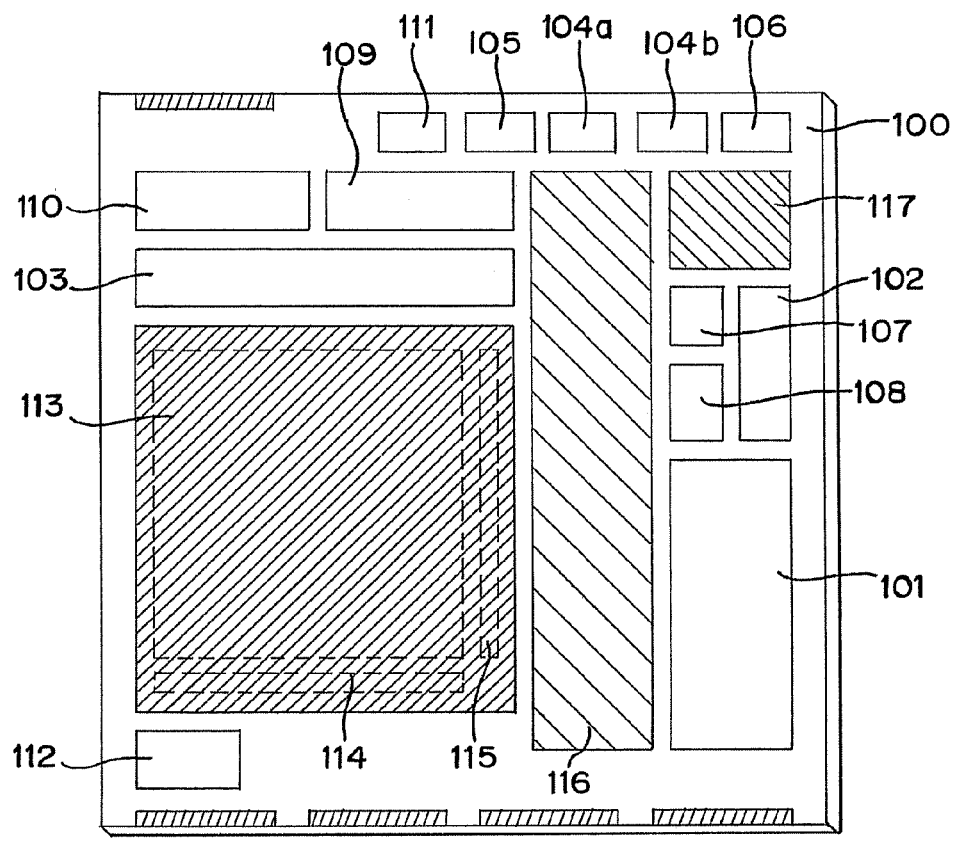
FIG. 9 shows a diagram illustrating Embodiment 2 according to the invention.

An embodiment of the invention is explained with reference to FIG. 9. A semiconductor device of the invention comprises mainly four blocks of a data memory block, a display block, an image processing block and a control block, and all blocks are disposed on a substrate 100. The data memory block comprises a program ROM (PROM)

101, a working area RAM (WRAM) 102, an audio data program ROM (Audio ROM) 103, line buffers RAM 104*a* and 104*b*, an in range RAM (INRAM) 105, a color pallet RAM (CRAM) 106, a memory controller 107, a decoder/register 108, an audio data program ROM controller 109, an audio data DA converter circuit/operational amplifier 110, a memory reference power generation circuit (Vref power supply) 111 and a gradation power supply 112. The display block comprises a pixel portion 113, and driver circuits 114 and 115. The image processing block comprises an image processing circuit 116. The control block comprises a CPU 117.

As described above, in a semiconductor device having not only a display block but also a data memory block, an image processing block and a control block, the number of ICs to be connected is reduced so that downsizing, thinness and lightweight can be realized. In addition, in a semiconductor device in which a display block, an image processing block and a control block are adjacently disposed, the arrangement is according to a data flow to realize an accurate operation. The invention is applied to the structure of each memory constituting a memory block. This embodiment can be combined with the above embodiment modes freely.

Embodiment 3

As an example of electronic appliances to which the invention can be applied, a television device, a digital camera, a digital video camera, a portable telephone device (a portable telephone), a portable information terminal such as a PDA, a portable game machine, a monitor, a personal computer, a sound reproducing device such as a car audio, a video reproducing device comprising a recording medium such as a home game machine, or the like is given. Hereinafter, the specific examples are explained.

Figure 10:
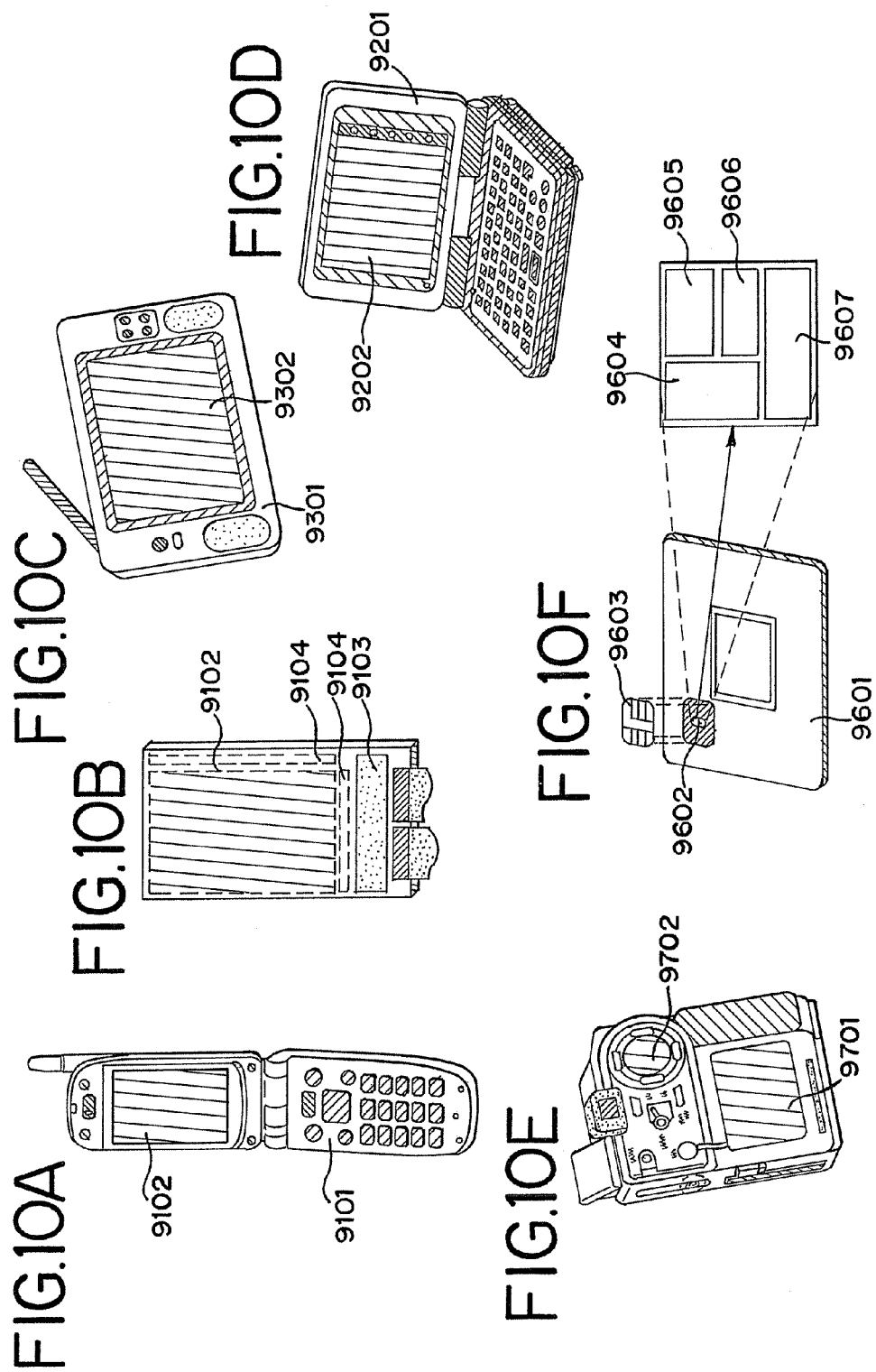
FIGS. 10A to 10F show diagrams illustrating Embodiment 3 according to the invention.
Figure 11:
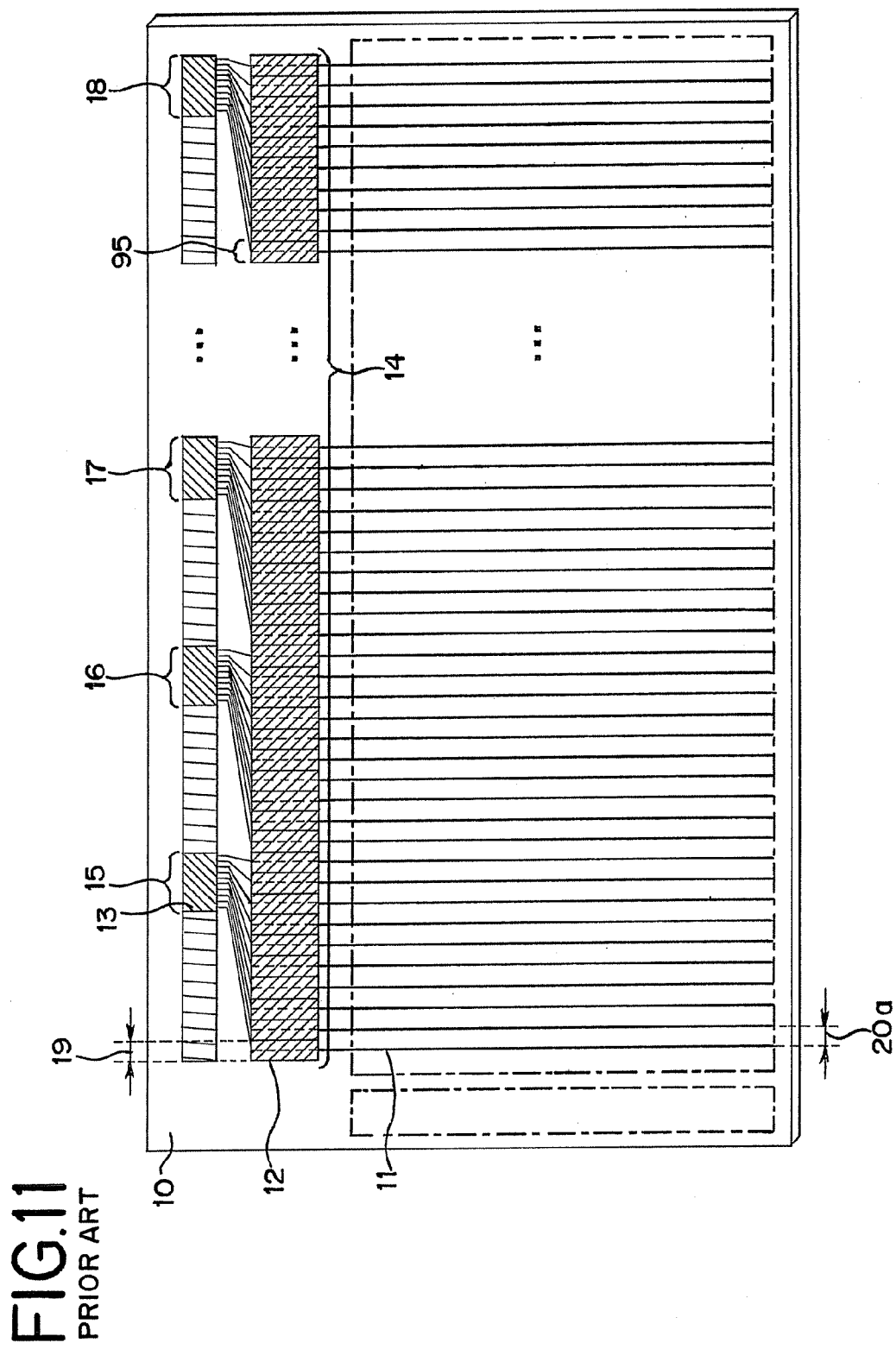
FIG. 11 shows a diagram illustrating a conventional technology.

FIG. 10A shows a portable telephone that includes a main body 9101, a display portion 9102, or the like. FIG. 10C shows a portable TV receiver that includes a main body 9301, a display portion 9302, or the like. FIG. 10D shows a portable information terminal that includes a main body 9201, a display portion 9202, or the like. FIG. 10E shows a digital video camera that includes display portions 9701, 9702, or the like.

A panel including a display portion comprises a driver circuit 9104, a functional circuit 9103 such as a CPU or a memory unit as shown in FIG. 10B. The invention is applied to the structure of the memory unit in the functional circuit 9103. An electronic appliance having a panel that is formed integrally with the functional circuit 9103 as well as with the driver circuit 9104 can has a reduced number of external ICs to be connected, thereby downsizing, lightweight and thinness can be realized. In addition, thinness, downsizing and light weight can be further advanced as compared with a case of using a liquid crystal element, because no back-light is required in adopting a self-luminous type light-emitting element as a display element for a display portion.

In addition, FIG. 10F shows a contact type IC card that includes a main body 9601, an IC chip 9602 and a module terminal 9603. The IC chip 9602 includes a RAM 9604, a ROM 9605, a CPU 9606, a RAM 9607, or the like. The invention is applied to the structure of a memory unit such as the RAMs 9604, 9607 and the ROM 9605 in the IC chip 9602. This embodiment can be combined with the above embodiment modes and the above embodiment freely.

What is claimed is:

1. A semiconductor device comprising:
   a plurality of bit lines and a plurality of word lines on a substrate having an insulating surface;
   a plurality of first element groups each selecting one among the plurality of bit lines; and
   a plurality of second element groups each amplifying a signal transmitted from the plurality of bit lines,
   wherein each of the second element groups is disposed between two of the first element groups.

2. A device according to claim 1, wherein each of the first element groups constitutes a part of a decoder.

3. A device according to claim 1, wherein each of the second element groups constitutes a sense amplifier.

4. A device according to claim 1, wherein each of the first element groups comprises a plurality of element formation regions to the number of the bit lines connected to the each of the first element groups, and
   wherein a pitch in rows of one of the plurality of element formation regions is different from a pitch between two adjacent bit lines.

5. A device according to claim 1, wherein the plurality of bit lines, the plurality of first element groups and the plurality of second element groups are disposed on a glass substrate.

6. A device according to claim 1, further comprising a memory element.

7. A device according to claim 1, further comprising one of a light-emitting element and a liquid crystal element.

8. A device according to claim 1, further comprising a control unit, a power generation unit and a transmitting and receiving unit.

9. A device according to claim 1, wherein the semiconductor device is mounted on an electronic appliances selected from the group consisting of a television device, a digital camera, a digital video camera, a portable telephone device, a portable information terminal, a portable game machine, a monitor, a personal computer, a sound reproducing device, and a video reproducing device comprising a recording medium.

10. A semiconductor device comprising:
    a plurality of bit lines and a plurality of word lines on a substrate having an insulating surface;
    a plurality of first element groups each selecting one among the plurality of bit lines; and
    a plurality of second element groups each amplifying a signal transmitted from the plurality of bit lines,
    wherein each of the first element groups and each of the second element groups are disposed alternately.

11. A device according to claim 10, wherein each of the first element groups constitutes a part of a decoder.

12. A device according to claim 10, wherein each of the second element groups constitutes a sense amplifier.

13. A device according to claim 10,
    wherein each of the first element groups comprises a plurality of element formation regions corresponding to the number of the bit lines connected to the each of the first element groups, and
    wherein a pitch in rows of one of the plurality of element formation regions is different from a pitch between two adjacent bit lines.

14. A device according to claim 10, wherein the plurality of bit lines, the plurality of first element groups and the plurality of second element groups are disposed on a glass substrate.

15. A device according to claim 10, further comprising a memory element.

16. A device according to claim 10, further comprising one of a light-emitting element and a liquid crystal element.

17. A device according to claim 10, further comprising a control unit, a power generation unit and a transmitting and receiving unit.

18. A device according to claim 10, wherein the semiconductor device is mounted on an electronic appliances selected from the group consisting of a television device, a digital camera, a digital video camera, a portable telephone device, a portable information terminal, a portable game machine, a monitor, a personal computer, a sound reproducing device, and a video reproducing device comprising a recording medium.

19. A semiconductor device comprising:
a substrate having an insulating surface;
a plurality of bit lines and a plurality of word lines constituting a memory cell array over the substrate;
a plurality of elements each constituting a part of a decoder over the substrate, the elements connected to bit lines; and
a plurality of a sense amplifiers over the substrate,
wherein each of the sense amplifiers is disposed between two of the elements.

20. A device according to claim 19, wherein each of the elements comprises the plurality of switches, logic circuits, and inverters.

21. A device according to claim 19,
wherein each of the elements comprises a plurality of element formation regions to the number of the bit lines connected to the each of the elements, and
wherein a pitch in rows of one of the plurality of element formation regions is different from a pitch between two adjacent bit lines.

22. A device according to claim 19, wherein the plurality of bit lines, the plurality of elements and the plurality of sense amplifiers are disposed on a glass substrate.

23. A device according to claim 19, further comprising a memory element.

24. A device according to claim 19, further comprising one of a light-emitting element and a liquid crystal element.

25. A device according to claim 19, further comprising a control unit, a power generation unit and a transmitting and receiving unit.

26. A device according to claim 19, wherein the semiconductor device is mounted on an electronic appliances selected from the group consisting of a television device, a digital camera, a digital video camera, a portable telephone device, a portable information terminal, a portable game machine, a monitor, a personal computer, a sound reproducing device, and a video reproducing device comprising a recording medium.

27. A semiconductor device comprising:
a substrate having an insulating surface;
a plurality of bit lines and a plurality of word lines constituting a memory cell array over the substrate;
a plurality of elements each constituting a part of a decoder over the substrate, the elements connected to the bit lines; and
a plurality of sense amplifiers over the substrate,
wherein each of the elements and each of the sense amplifiers are disposed alternately.

28. A device according to claim 27, wherein each of the elements comprises the plurality of switches, logic circuits, and inverters.

29. A device according to claim 27,
wherein each of the elements comprises a plurality of element formation regions corresponding to the number of the bit lines connected to the each of the elements, and
wherein a pitch in rows of one of the plurality of element formation regions is different from a pitch between two adjacent bit lines.

30. A device according to claim 27, wherein the plurality of bit lines, the plurality of elements and the plurality of sense amplifiers are disposed on a glass substrate.

31. A device according to claim 27, further comprising a memory element.

32. A device according to claim 27, further comprising one of a light-emitting element and a liquid crystal element.

33. A device according to claim 27, further comprising a control unit, a power generation unit and a transmitting and receiving unit.

34. A device according to claim 27, wherein the semiconductor device is mounted on an electronic appliances selected from the group consisting of a television device, a digital camera, a digital video camera, a portable telephone device, a portable information terminal, a portable game machine, a monitor, a personal computer, a sound reproducing device, and a video reproducing device comprising a recording medium.

* * * * *